United States Patent [19]

Adachi et al.

[11] Patent Number: 5,023,204

[45] Date of Patent: Jun. 11, 1991

[54] METHOD OF MANUFACTURING SEMICONDUCTOR DEVICE USING SILICONE PROTECTIVE LAYER

[75] Inventors: Etsushi Adachi; Hiroshi Adachi; Osamu Hayashi; Kazuo Okahashi, all of Amagasaki, Japan

[73] Assignee: Mitsubishi Denki Kabushiki Kaisha, Japan

[21] Appl. No.: 298,950

[22] Filed: Jan. 19, 1989

[30] Foreign Application Priority Data

Jan. 21, 1988 [JP] Japan .................. 63-11217

[51] Int. Cl.$^5$ .......................................... H01L 21/02
[52] U.S. Cl. .................................. 437/228; 437/231; 437/235
[58] Field of Search ........................................ 437/235

[56] References Cited

FOREIGN PATENT DOCUMENTS

| | | |
|---|---|---|
| 52-127174 | 10/1977 | Japan . |
| 56-135928 | 10/1981 | Japan . |
| 60-249326 | 12/1985 | Japan . |
| 62-247522 | 10/1987 | Japan . |
| 63-014432 | 1/1988 | Japan . |
| 63-107122 | 3/1988 | Japan . |
| 63-120774 | 5/1988 | Japan . |
| 1-185924 | 7/1989 | Japan . |
| 1-307227 | 12/1989 | Japan . |
| 2-009153 | 1/1990 | Japan . |

OTHER PUBLICATIONS

"Effect of Atomic Oxygen on Polymers", Journal of Polymer Science, Part A, vol. 3, pp. 2205-2214, 1965.
"Mechanism of Oxygen Plasma Etching of Polydimethyl Siloxane Films", Applied Physics Letters, vol. 46, Jan. 1, 1985, pp. 31-33.

Primary Examiner—Brian E. Hearn
Assistant Examiner—Laura M. Holtzman
Attorney, Agent, or Firm—Leydig, Voit & Mayer

[57] ABSTRACT

A stress relaxation protective layer made of a silicone material is formed on a coating covering a circuit disposed on a substrate of a semiconductor device, and a predetermined depth of the surface of the stress relaxation protective layer is modified. A resist is formed on the thus-modified surface of the stress relaxation protective layer, and the thus-formed resist is patterned so that the resist in a predetermined region is removed. The stress relaxation protective layer in the region from which the above-described resist has been removed is removed by etching, and the remaining resist is removed. Next, the coating layer in the region from which the stress relaxation protective layer has been removed is removed by etching with the remaining stress relaxation protective layer used as a mask so that the circuit is exposed. The manufacturing process for semiconductor devices can be significantly simplified since the resist patterning needs to be performed only once and the resist removal can be performed by a dry treatment.

5 Claims, 6 Drawing Sheets

METHOD OF MANUFACTURING SEMICONDUCTOR DEVICE USING SILICONE PROTECTIVE LAYER

BACKGROUND OF THE INVENTION

1. Field of the Invention

The present invention relates to a method of manufacturing semiconductor devices using a silicone protective layer which is capable of serving as a stress relaxation protective layer for the semiconductor devices.

2. Description of the Related Art

Hitherto, as published in 7, 9-15 (1983) "Kino Zairyo (functional material)" or 51, No. 7, 554-558 (1983) "Denki Kagaku (electro chemistry)", polyimide materials have been used as a stress relaxation protective layer of the type to be provided for semiconductor devices such as EPROMs. Such polyimide materials exhibit an easy film forming possibility and form protective layers having an excellent heat resistance. However, the polyimide materials produce, as shown in FIGS. 1 (A) to (I), a problem in the manufacturing process for semiconductor devices because that manufacturing process for forming circuit patterns, such as bonding pads, is involved and too complicated.

Figure 1:
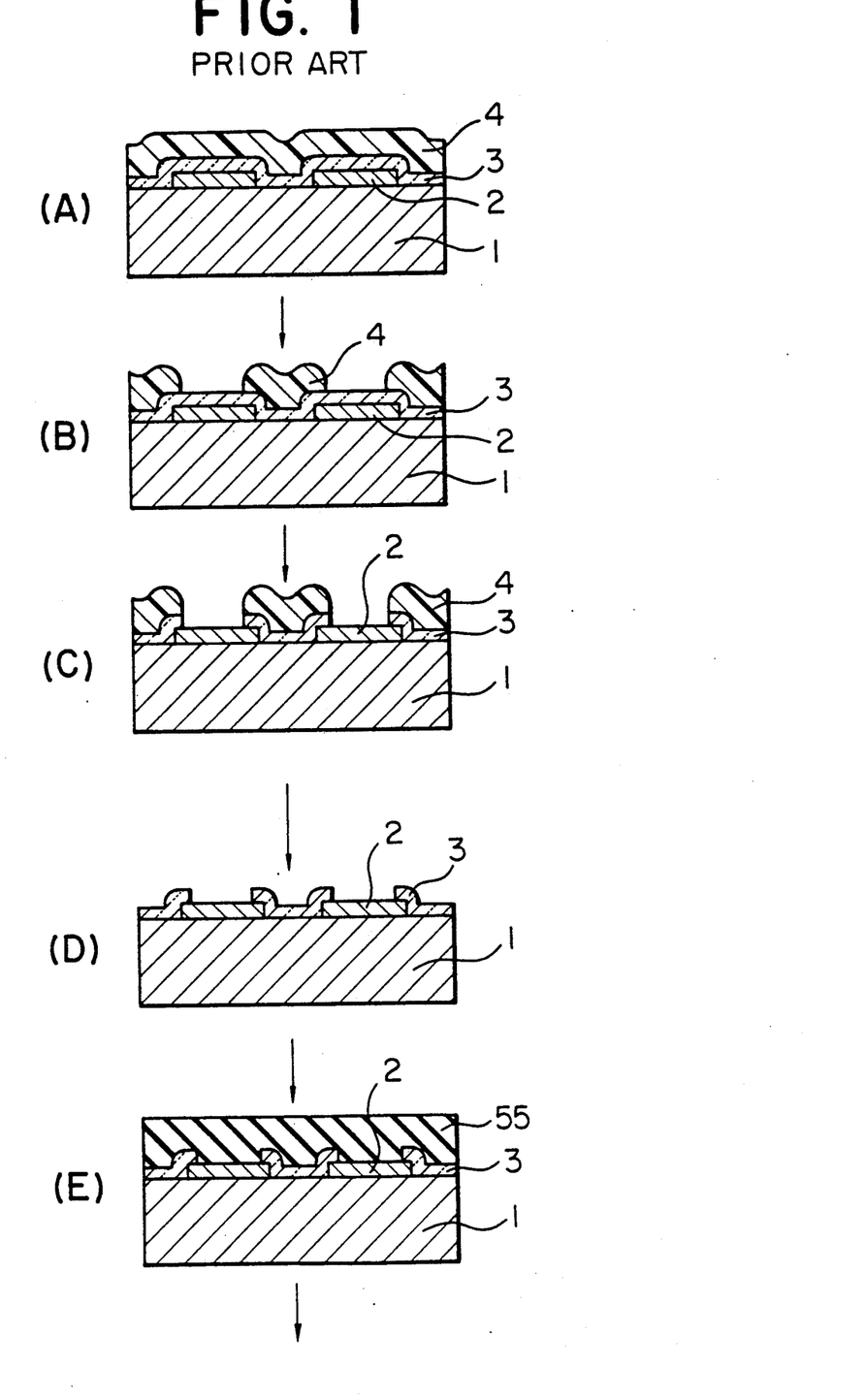

FIGS. 1 (A) to (I) are cross-sectional views illustrating the steps of a process included in a manufacturing process for the semiconductor devices in which a stress relaxation protective layer is formed and pad apertures used for wire-bonding the aluminum circuit are bored by the conventional methods. In that conventional method, as shown in FIG. 1 (A), a resist 4 is applied to a silicon substrate 1 on which an aluminum circuit 2 has been disposed and covered by the glass coat layer 3. Next, as shown in FIGS. 1 (B) to 1 (D), the resist 4 is patterned, and the glass coat layer 3 is etched by a dry treatment using a plasma of the gas obtained by mixing carbon tetrafluoride and oxygen. Then, the resist 4 is removed by a dry treatment using an oxygen plasma.

Next, as shown in FIG. 1 (E), a stress relaxation protective layer 55 comprising a polyimide material is formed on the circuit 2 and the glass coat layer 3. Then, as shown in FIGS. 1 (F) and (G), another resist 4 is applied for the purpose of forming the pad apertures, and is patterned. Next, as shown in FIGS. 1 (H) and (I), the stress relaxation protective layer 55 is etched using an alkali solution, and the resist 4 is removed by a wet treatment using a solvent such as acetone and n-butyl acetate so that the pad is formed.

Figure 2:
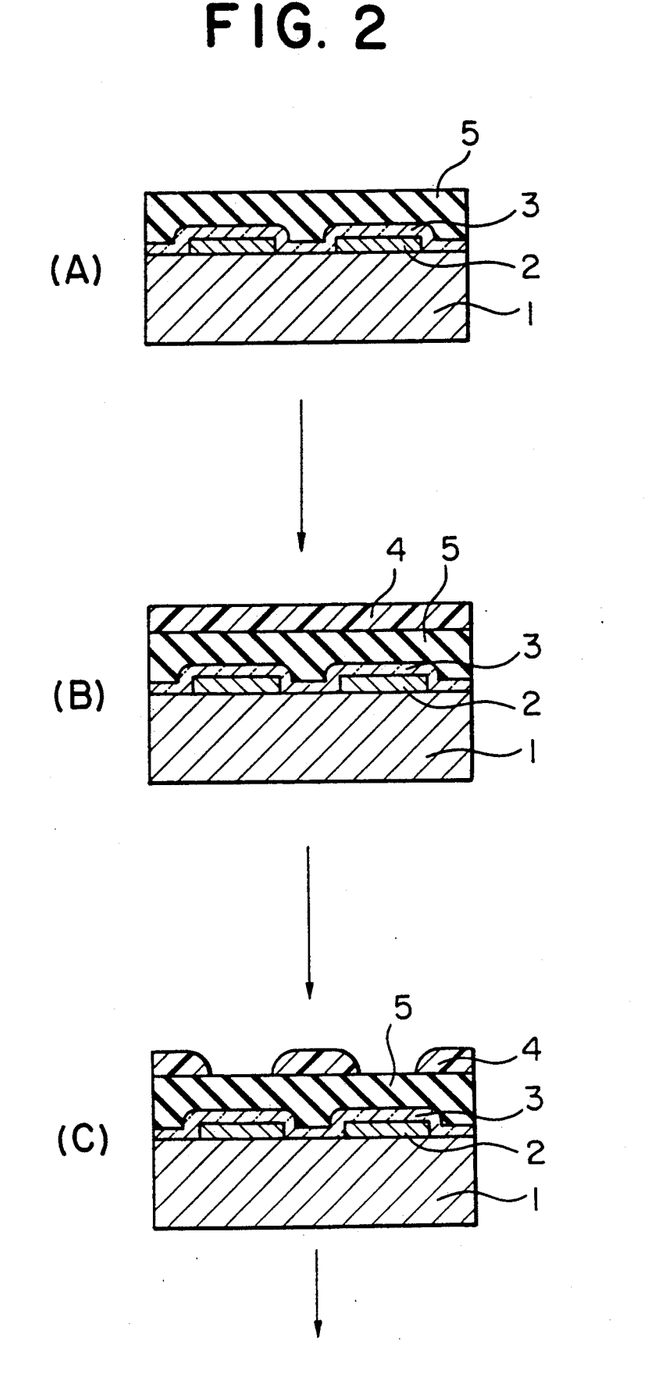

In the conventional method, patterning of the resist 4 needs to be conducted twice. This is because the stress relaxation protective layer 55 which is formed after the glass coat layer 3 has been etched also needs to be etched. As shown in FIG. 2 in which the present invention is illustrated as described later, if the glass coat layer 3 can be etched with the stress relaxation protective layer 5 used as a mask, the number of resist patterning steps can be reduced to one. However, as described above, the stress relaxation protective layer 55 generally comprises a polyimide material. Therefore, a problem arises in that the surface of the polyimide stress relaxation protective layer 55 can be degenerated by the plasma of a mixed gas formed by carbon fluoride and oxygen used to etch the glass coat 3. Another problem arises in that an oxygen plasma treatment which can be easily performed cannot be applied to an operation for removing the resist used for pattern-forming the stress relaxation protective layer 55. The reason for this is that polyimide materials can be incinerated during the oxygen plasma treatment. Furthermore, since even the silicone materials can crack when an oxygen plasma treatment is applied thereto, a wet treatment needs to be used for removing the resist but cannot easily be carried out.

SUMMARY OF THE INVENTION

To this end, an object of the present invention is to provide a method of manufacturing semiconductor devices in which the manufacturing process can be significantly simplified with respect to the resist patterning in that the pad aperture forming process needs to be performed only once, and the resist removal and etching of the glass coat layer can be completed by dry treatments.

A method of manufacturing semiconductor devices in which a silicone protective layer is used, comprises the steps of:

(a) forming a stress relaxation protective layer made of a silicone material on a coating layer which covers a circuit disposed on a substrate of the semiconductor device;

(b) modifying the surface of the thus-formed stress relaxation protective layer;

(c) forming a resist on the thus-modified surface of the stress relaxation protective layer;

(d) removing the resist in a predetermined region by patterning;

(e) removing the stress relaxation protective layer in the region from which the resist has been removed by etching;

(f) removing the resist which has been left; and (g) etching the coating layer in the region from which the stress relaxation protective layer has been removed by using the remaining stress relaxation protective layer as a mask so thereby to allow the circuit to appear.

BRIEF DESCRIPTION OF THE DRAWINGS

FIGS. 1 (A) to 1(I) are cross-sectional views illustrating a semiconductor device which is subjected to a conventional manufacturing process in which a bonding pad is formed;

FIGS. 2 (A) to 2(F) are cross-sectional views illustrating a semiconductor device which is subjected to a manufacturing process in which a bonding pad is formed according to an embodiment of the present invention;

DESCRIPTION OF THE PREFERRED EMBODIMENT

A plasma-resisting type stress relaxation protective layer according to the present invention cannot be etched by a carbon tetrafluoride plasma and is free of cracks even if subjected to an oxygen plasma. Such silicone stress relaxation protective layer can be exemplified by a protective layer comprising a ladder silicone polymer exemplified by the following general formula (I) published in 7, 14–15 (1983) "Kino Zairyo (functional material)" or 51, No. 7, 555-5556 (1983) "Denki Kagaku":

(wherein, $R_1$ represents a phenyl group or a lower alkyl group preferably having 1 to 5 carbon atoms, $R_2$ represents a hydrogen atom, methyl group or a ethyl group, and n represents integer 2 to 1000, preferably 50 to 500). It is preferable for the thickness of the stress relaxation protective layer to be 2 to 10 μm.

The stress relaxation protective layer comprising the above-described type of a polymer displays a sufficient carbon tetrafluoride resistance to serve as a mask when a glass coat layer is etched with a conventional carbon tetrafluoride plasma. Furthermore, the surface of the stress relaxation protective layer can be changed to an $SiO_2$ layer with a surface modification treatment using an inert gas so that this stress relaxation protective layer can become a layer which can be free from crack generation even if the same is subjected to an oxygen plasma. Therefore, such a stress relaxation protective layer can serve as a resist at the time of etching the glass coat layer with a carbon tetrafluoride plasma.

An embodiment of the present invention in which the above-described stress relaxation protective layer is used will now be described with reference to FIGS. 2 (A) to (F). First, a stress relaxation protective layer 5 is, as shown in FIG. 2 (A), formed. The above-described type of polymer serving as a stress relaxation protective layer 5 is applied to a silicon substrate 1 on which an aluminum circuit 2 has been disposed and covered with a glass coat layer 3. This polymer is applied by a rotation application method or the like to form a dried thickness of 2 to 10 μm. This polymer is in a solution in a concentration of 5 to 30% (weight % hereinafter). This solution is prepared by dissolving the polymer in an organic solvent such as toluene, anisole, or tetrahydrofuran. Next, the thus applied polymer is baked at 150° to 300° C. for 1 to 2 hours in a nitrogen atmosphere so that the stress relaxation protective layer 5 is formed. In this process, the above-described silicon substrate 1, aluminum circuit 2 and the glass coating layer 3 serving as a coating layer are same as in the conventional types.

Then, the surface of the street relaxation protective layer 5 is modified by a plasma treatment method using an inert gas such as nitrogen, argon, or neon or by an ion implantation of these gases. The above-described plasma may be generated by RF (Radio Frequency), microwave, or ECR (Electron Cyclatron Resonance) method. It is preferable for the plasma treatment to be conducted with a gas flow 20 to 100 cc/min, pressure 0.5 to 1 Torr, electric power 300 W to 1 kW, and treatment time 15 to 60 minutes when an RF drive, $N_2$ plasma is employed. It is also preferable for the inert gas such as nitrogen, argon, or neon to be implanted, for example in a case of nitrogen, at a density of implantation 1 to $5 \times 10^{17}$ $N^+/cm^2$, and an implanting energy of 50 to 100 kev.

In this case, the above description "surface modification" is defined such that the stress relaxation protective layer 5 is converted into an $SiO_2$ layer to the preferable depth of from 0.1 to 0.5 μm from the surface thereof.

Then, as shown in FIGS. 2 (B) and (C), a resist 4 with the thickness of from 2 to 3 μm preferably a conventional positive resist is formed for the purpose of etching the stress relaxation protective layer 5. Next, the thus-formed resist 4 is exposed using a predetermined mask to form a pattern.

Next, as shown in FIGS. 2 (D) and (E), the stress relaxation protective layer 5 is dry etched in a plasma such as $CHF_3$. Then, the resist 4 is incinerated and removed by an oxygen plasma, preferably at a pressure of 1 Torr and an RF electric power of 400 W.

Next, using the stress relaxation protective layer 5 which has been etched as shown in FIG. 2 (F) as a mask, the glass coat layer 3 is etched by a carbon tetrafluoride plasma, preferably a $CF_4/O_2$ plasma containing 5% $O_2$ at a pressure of 1 Torr and RF electric power of 400 to 500 W. As a result, the circuit 2 is exposed so that a circuit pattern such as a bonding pad which the stress relaxation protective layer 5 had coated can be formed on semiconductor devices.

When the glass coat layer 3 shown in FIG. 2 (F) is etched, the portion of the stress relaxation protective layer 5 which has been modified to an $SiO_2$ layer is etched and is thereby removed. However, since the portion below the $SiO_2$ layer comprises a silicone material, it cannot be removed and can serve as a mask.

In the conventional method, as described above referring to FIGS. 1 (A) to 1 (I), the apertures formed in the glass coat layer 3 and in the stress relaxation protective layer 55 are, in the majority of cases, performed individually. Therefore, each resist 4 of the layers needs to be separately patterned. However, in the method according to the present invention, since the glass coat layer 3 is, as shown in FIG. 2 (F), etched by the carbon tetrafluoride plasma with the patterned stress relaxation protective layer 5 used as a mask, patterning of the resist 4 needs to be performed only once. Furthermore, since the removal of the resist 4 can be completed by a dry method, the manufacturing process can be significantly simplified.

The manufacturing method according to the present invention will be specifically described with reference to an Example. However, the present invention is not limited to this example.

EXAMPLE

Figure 3:
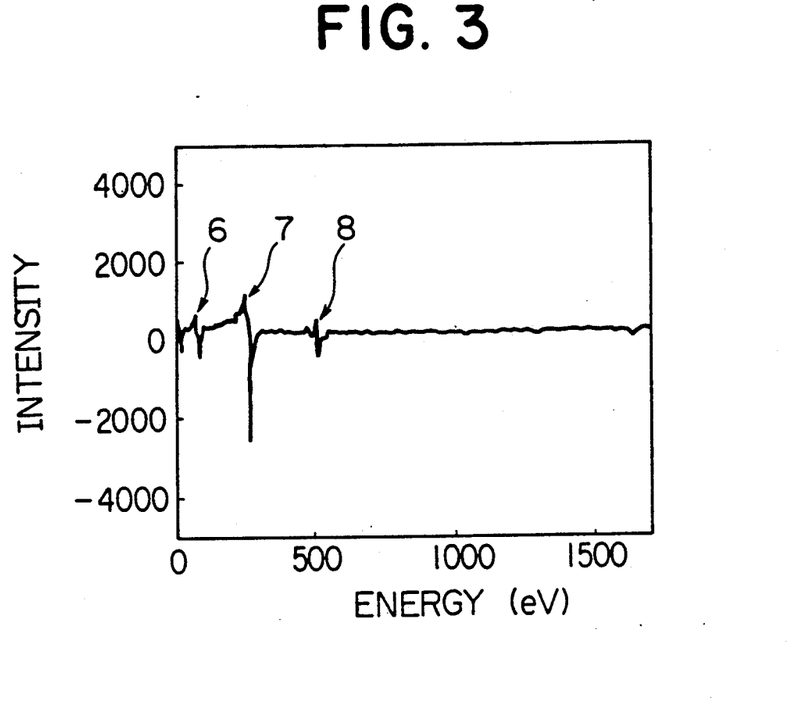
FIG. 3 is a graph illustrating an Auger electron spectrum from the surface of a stress relaxation protective layer.

A silicone polymer represented by a formula:

and having an average molecular weight of 100,000 was dissolved in anisole to form a 20% concentration solution. Then, this solution was applied to the silicon substrate 1 on which the aluminum circuit 2 with a thickness of 1 μm had been disposed, as shown in FIG. 2 (A), and covered with the glass coat layer 3 to a thickness of 1 μm. This silicone polymer was applied by a rotation application method to make the dried thickness thereof 5 μm. Next, the thus-applied silicone polymer was baked at 250° C. for one hour so that the stress relaxation protective layer 5 was formed. Then, the surface of the thus-obtained stress relaxation protective layer 5 was investigated by an Auger electron spectrum method (called "AES" hereinafter), the spectrum thereof being shown in FIG. 3. Referring to FIGS. 3, a peak 6 corresponding to Si, a peak 7 corresponding to C, and a peak of O can be seen.

Figure 4:
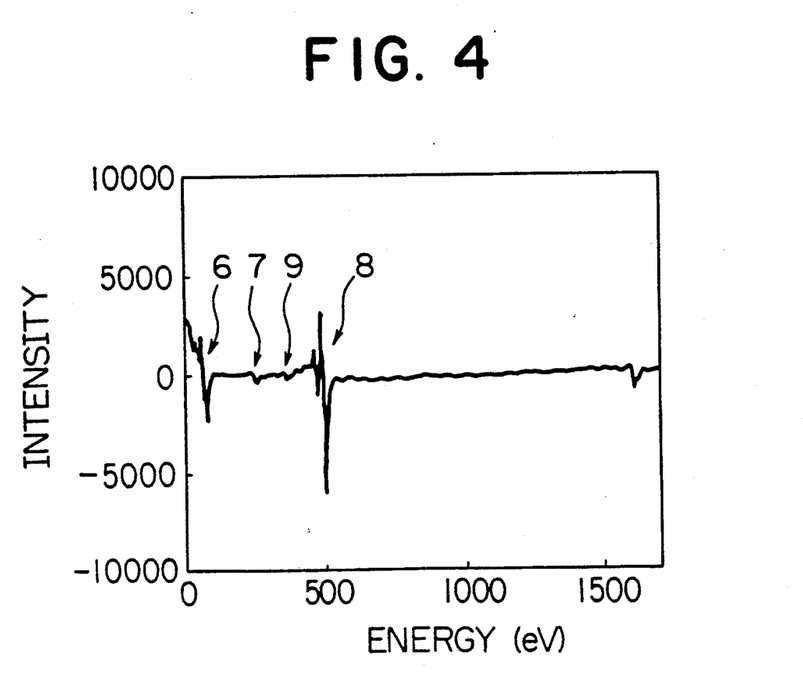
FIG. 4 is a graph illustrating an Auger electron spectrum from the surface of a stress relaxation protective layer which has been subjected to a nitrogen plasma treatment.

Next, the surface of the stress relaxation protective layer 5 was subjected to a plasma for 60 minutes at a nitrogen gas pressure 0.8 Torr and RF electric power 300 W so that the surface was modified by the nitrogen gas plasma treatment. The AES of the thus-modified surface is shown in FIG. 4. Referring to FIG. 4, the peak 7 corresponding to C has become extremely small, and a slight residual peak 9 corresponding to N can be seen. It can be understood from this that the organic components on the surface of the stress relaxation protective layer 5 have been removed and that this surface was converted into an SiO₂ layer. Although a slight amount of N can be taken in the surface, it cannot lead to any problem since it can be removed simultaneously with etching the glass coat layer.

Then, as shown in FIGS. 2 (B) and 2 (C), a resist with a thickness of 2 μm was formed by using a positive type resist, for example, OFPR-800 manufactured by Tokyo Oka Kogyo. Next, the thus-formed resist was exposed using a predetermined mask and patterned.

Then, as shown in FIGS. 2 (D) and 2 (E), the stress relaxation protective layer 5 was etched with a plasma of CHF₃ under pressure of 1 Torr and RF electric power of 400 W. Next, the resist 4 was treated with an oxygen plasma under a pressure of 1 Torr and RF electric power of 400 W so that the resist 4 was incinerated and thereby removed.

Next, as shown in FIG. 2 (F), the glass coat layer 3 was etched with a carbon tetrafluoride (O₂: 5%) plasma under a pressure of 1 Torr and RF electric power of 400 W by using the thus-etched stress relaxation protective layer 5 as a mask. As a result, the stress relaxation protective layer 5 was provided on the semiconductor device, and a pad to be used for wire bonding to the aluminum circuit 2 was provided. No cracks could be found in the stress relaxation protective layer 5 provided with the pad.

Figure 5:
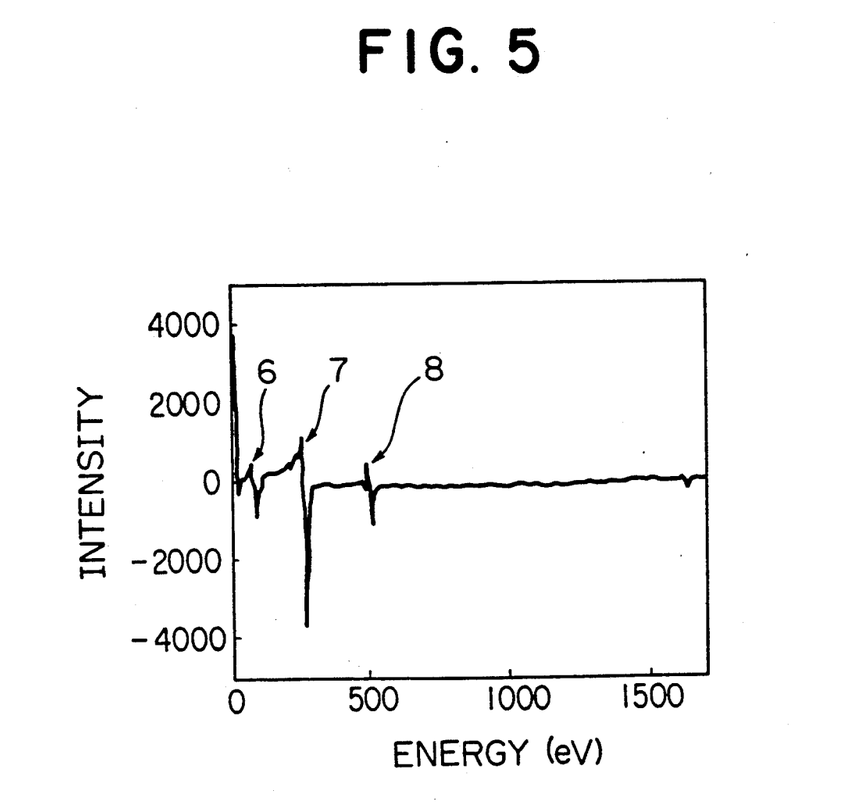
FIG. 5 is a graph illustrating an Auger electron spectrum of the surface from the stress relaxation protective layer of FIG. 4 which has been sputtered for two minutes after it had been subjected to the nitrogen plasma treatment.

For reference, FIG. 5 illustrates the AES results of the surface of the stress relaxation protective layer according to the present invention which has been subjected to a nitrogen plasma treatment and then been subjected to a sputtering with Ar for two minutes. In FIG. 5, each peak of Si, C, and O approximates the corresponding peaks shown in FIG. 3. As can be clearly seen from this, only the surface (0.15 μm or less) is changed into an SiO₂ layer by such nitrogen plasma treatment.

Although the plasma treatment with nitrogen was performed in the Example, a plasma of an inert gas such as Ar or Ne may be employed, or a treatment by ion implanting such inert gas may also be employed. Furthermore, the plasma of such inert gases can be generated with the similar effect described with respect to the above Example regardless of the type of plasma i.e., RF-driven, microwave-driven and ECR.

What is claimed is:

1. A method of manufacturing semiconductor devices in which a silicone protective layer is used comprising:
   forming a stress relaxation protective layer of a silicone material on a glass coating layer directly contacting and covering a circuit disposed on a substrate of the semiconductor device;
   modifying the surface of the thus-formed stress relaxation protective layer with an inert gas;
   forming a resist on the thus-modified surface of said stress relaxation protective layer;
   removing the resist in a predetermined region by patterning;
   removing the stress relaxation protective layer in the region from which the resist has been removed by etching;
   removing the remaining resist; and
   etching the glass coating layer in the region from which said stress relaxation protective layer has been removed by using the remaining stress relaxation protective layer as a mask, thereby exposing the circuit.

2. The manufacturing method according to claim 1 including modifying the surface of the stress relaxation protective layer with a plasma treatment in the inert gas.

3. The manufacturing method according to claim 1 including modifying the surface of the stress relaxation protective layer by ion implantation of the inert gas.

4. The manufacturing method according to claim 1 including modifying the surface of the stress relaxation protective by converting the surface of the stress relaxation protective layer to an SiO₂ layer.

5. The manufacturing method according to claim 4 including converting the surface of the stress relaxation protective layer to a depth of from 0.1 to 0.5 μm.

* * * * *

UNITED STATES PATENT AND TRADEMARK OFFICE
CERTIFICATE OF CORRECTION

PATENT NO. : 5,023,204

DATED : June 11, 1991

INVENTOR(S) : Adachi et al

It is certified that error appears in the above-identified patent and that said Letters Patent is hereby corrected as shown below:

Column 6, line 57, claim 4, after "protective" insert --layer--.

Signed and Sealed this

Third Day of November, 1992

Attest:

DOUGLAS B. COMER

*Attesting Officer*   *Acting Commissioner of Patents and Trademarks*